(12) United States Patent
You et al.

(10) Patent No.: US 10,998,201 B2
(45) Date of Patent: May 4, 2021

(54) SEMICONDUCTOR ENCAPSULATION STRUCTURE

(71) Applicant: Shenzhen Refond Optoelectronics Co., Ltd., Shenzhen (CN)

(72) Inventors: Zhi You, Shenzhen (CN); Xiaoming Pei, Shenzhen (CN)

(73) Assignee: Shenzhen Refond Optoelectronics Co., Ltd., Shenzhen (CN)

( * ) Notice: Subject to any disclaimer, the term of this patent is extended or adjusted under 35 U.S.C. 154(b) by 0 days.

(21) Appl. No.: 16/610,346

(22) PCT Filed: Apr. 2, 2018

(86) PCT No.: PCT/CN2018/081601
§ 371 (c)(1),
(2) Date: Nov. 1, 2019

(87) PCT Pub. No.: WO2018/201837
PCT Pub. Date: Nov. 8, 2018

(65) Prior Publication Data
US 2020/0144079 A1    May 7, 2020

(30) Foreign Application Priority Data

May 4, 2017   (CN) .......................... 201720489247.3

(51) Int. Cl.
*H01L 21/56*    (2006.01)
*H01L 21/52*    (2006.01)
*H01L 23/10*    (2006.01)
*H01L 23/00*    (2006.01)
*H01L 23/06*    (2006.01)

(52) U.S. Cl.
CPC .............. *H01L 21/56* (2013.01); *H01L 21/52* (2013.01); *H01L 23/06* (2013.01); *H01L 23/10* (2013.01); *H01L 24/83* (2013.01)

(58) Field of Classification Search
CPC ......... H01L 21/56; H01L 21/52; H01L 23/06; H01L 23/10; H01L 24/83
USPC .......................................................... 257/678
See application file for complete search history.

(56) References Cited

U.S. PATENT DOCUMENTS

2008/0231145 A1\*   9/2008   Nagano .................... H01L 23/10
                                                                    310/344
2013/0050227 A1\*   2/2013   Petersen ................. B81B 7/007
                                                                    345/501

FOREIGN PATENT DOCUMENTS

CN         103956343 A      7/2014
CN         10437280 A       9/2014
                    (Continued)

*Primary Examiner* — Tong-Ho Kim

(57) ABSTRACT

Provided is a semiconductor encapsulation structure, including: a device base (1) and a cover plate (2). The device base is provided with a cavity (11) for accommodating a chip (3). The device base is further provided with a cover-plate sintered layer (12). The cover-plate sintered layer is metallized. The cover plate matches the device base. The cover plate is provided with a base sintered layer (22). The base sintered layer is also metallized. The cover plate is connected to the base by sintering. The cover plate is connected to the base by sintering, so that low-temperature connection is achieved, thereby avoiding damage to the chip and electronic components in the base caused by high connection temperature. Furthermore, encapsulating costs are greatly reduced while ensuring connection reliability.

17 Claims, 2 Drawing Sheets

(56) References Cited

FOREIGN PATENT DOCUMENTS

CN   104037280 A  *  9/2014
CN   106373925 A     2/2017

* cited by examiner

SEMICONDUCTOR ENCAPSULATION STRUCTURE

CROSS-REFERENCE TO RELATED APPLICATIONS

This application is a national stage application under 35 U.S.C. 371 of PCT Application No. PCT/CN2018/081601 having an international filing date of 2 Apr. 2018, which PCT application claimed the benefit of Chinese Patent Application No. 201720489247.3, filed on 4 May 2017, the entire disclosure of each of which are herein incorporated by reference.

FIELD

The disclosure relates to the encapsulating field, and in particular, to a semiconductor encapsulation structure.

BACKGROUND

Conventional semiconductor encapsulating is usually conducted in two manners. One is soldering with a solder, in which a substrate and a cover plate are metallized first, and then a solder material is used for reflow soldering. This manner is eutectic soldering with a metal solder. The other is parallel welding, in which metal materials at a contact surface of a base and a cover plate which have the metal materials provided at a welding position thereof, are instantaneously melted and welded according to the principle of electric resistance welding. Both manners are airtight encapsulating and have relatively high material costs and production equipment costs.

SUMMARY

The technical problem to be resolved by the disclosure is to provide a semiconductor encapsulation structure with secure connection and a high price-performance ratio.

A technical solution provided by the disclosure to resolve the technical problem of the disclosure is as follows.

In the disclosure, an interface connection method is used to solder two interfaces together by a sintering material to form a semiconductor encapsulation structure, including: a semiconductor encapsulation structure including: a device base and an upper cover plate, wherein the device base is provided with a cavity structure used for accommodating a chip, a top surface of the base is further provided with a metallized cover-plate sintered layer, the cover plate is provided with a metallized base sintered layer, and the cover plate is connected to the base through the cover-plate sintered layer and the base sintered layer.

As an improvement to the foregoing solution, the base is made of metal, ceramics, glass, plastic or fiberboard, and the cover plate is made of metal, ceramics, glass or quartz.

As an improvement to the foregoing solution, metallizing is conducted by using one or more materials selected from a group consisting of copper, silver, gold, nickel, palladium, aluminum, tin, platinum, and zinc.

As an improvement to the foregoing solution, sintering paste for sintering may be applied to the base sintered layer and/or the cover-plate sintered layer through printing or dispensing.

As an improvement to the foregoing solution, the sintering paste includes metal particles and a solvent, the metal particles are one or more of gold particles, silver particles, and copper particles, and the solvent may be a resin material.

As an improvement to the foregoing solution, the sintering paste is applied with a thickness between 5 micrometers and 100 micrometers.

As an improvement to the foregoing solution, the sintering paste is baked and sintered by a heating device.

As an improvement to the foregoing solution, the temperature of baking and sintering is between 100° C. and 500° C.

As an improvement to the foregoing solution, electrically interconnected circuits and the chip are disposed inside the base.

The beneficial effect of the disclosure is as follows: The cover plate is connected to the base through the base sintered layer and the cover-plate sintered layer, so that low-temperature connection is achieved, thereby avoiding damage to the chip and electronic components in the base caused by high connection temperature. More importantly, encapsulating costs are greatly reduced while connection reliability is ensured.

BRIEF DESCRIPTION OF THE DRAWINGS

To describe the technical solutions in the embodiments of the disclosure more clearly, the following briefly describes the accompanying drawings required for describing the embodiments.

DETAILED DESCRIPTION OF THE EMBODIMENTS

The concept, specific structures, and produced technical effects of the disclosure are clearly and thoroughly described below with reference to the embodiments and the accompanying drawings for thorough understanding of the objectives, features, and effects of the disclosure. It should be noted that the embodiments in the present application and the features in the embodiments may be combined with each other without causing any conflict. In addition, the descriptions of "up", "down", "left", "right", and the like used in the disclosure are merely provided based on the relative position relationships between the components of the disclosure.

Figure 1:
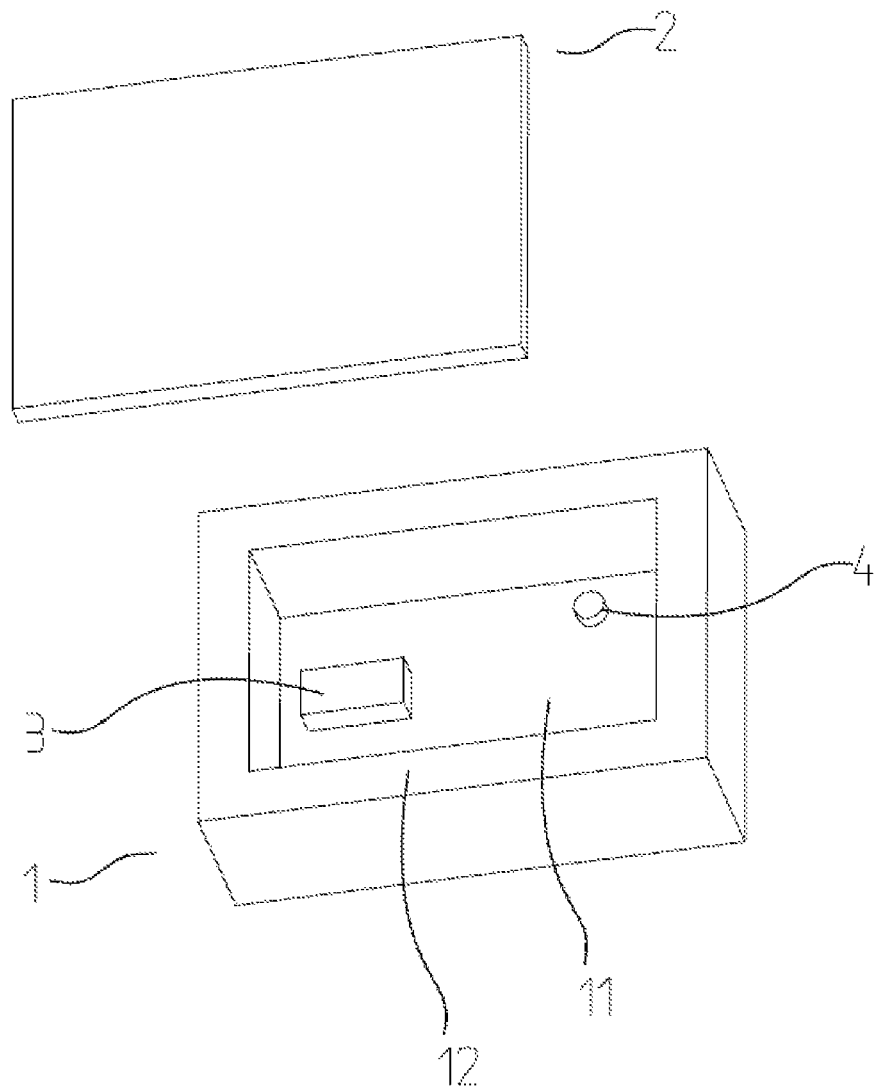
FIG. 1 is a schematic diagram according to an embodiment of the disclosure.
Figure 2:
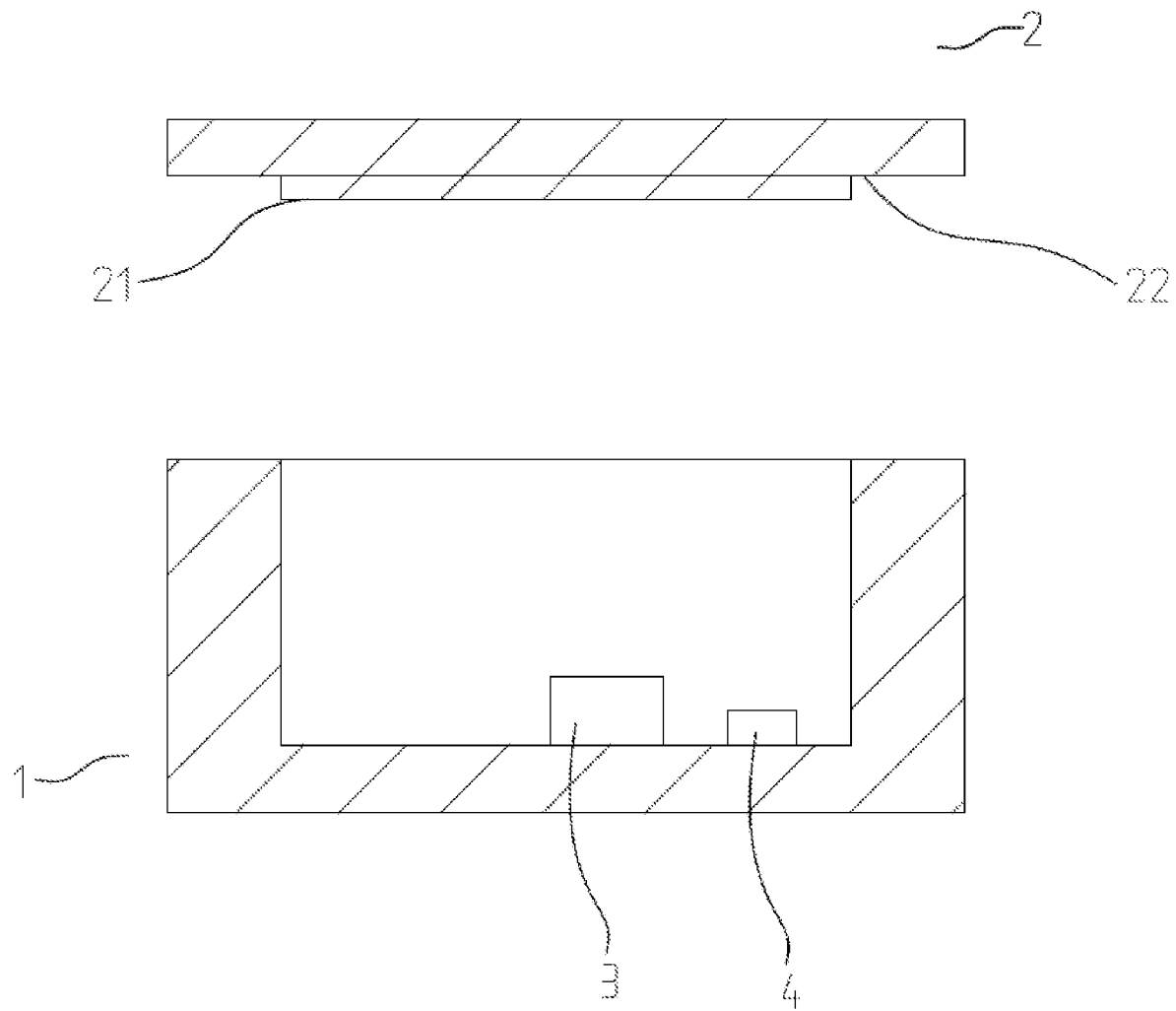
FIG. 2 is a sectional view according to an embodiment of the disclosure.

FIG. 1 is a schematic diagram according to an embodiment of the disclosure. FIG. 2 is a sectional view according to an embodiment of the disclosure. Referring to FIG. 1 and FIG. 2, a semiconductor encapsulation structure includes a device base 1 and a cover plate 2. The device base 1 may be made of one or more materials selected from a group consisting of metal, ceramics, glass, plastic, and fiberboard. The device base 1 is provided with a cavity 11 in which an encapsulated chip 3 and electrically interconnected circuits (not shown) are arranged. The device base 1 is provided with a metallized cover-plate sintered layer 12. The metallizing may be conducted by using one or more materials selected from a group consisting of copper, silver, gold, nickel, palladium, aluminum, tin, platinum, and zinc. A wide variety of metallizing materials may be chosen. In one aspect, an optimal metallizing material may be chosen as required. In another aspect, a metallizing material with a relatively high price-performance ratio may be used according to cost control requirements, thereby reducing metallizing costs. Preferably, one or more of gold, silver, and nickel may be chosen as the metallizing material. The cover plate 2 generally has a cubic form. The cover plate 2 may be made of metal, ceramics, glass or quartz. The cover plate 2 is provided with a boss 21 which matches the cavity 11 in the device base 1 to protect electronic components such as the chip 3, a sensor 4 or connecting cables inside the cavity 11. The cover plate 2 is further provided with the cover-plate sintered layer 12. The cover-plate sintered layer 12 is metallized. The metallizing may be conducting by using one or more materials selected from a group consisting of copper, silver, gold, nickel, palladium, aluminum, tin, platinum, and zinc. A corresponding metallizing material may be chosen according to the connection requirements and cost control requirements to metallize the cover-plate sintered layer 12 on the cover plate 2. Preferably, one or more of gold, silver, and nickel may be chosen as the metallizing material.

The device base 1 is connected to the cover plate 2 through sintering. The cover-plate sintered layer 12 and a base sintered layer 21 are metallized, so that in the process of sintering and connecting the base sintered layer and the cover-plate sintered layer 12, a connecting surface and sintering paste can be fused and connected more adequately. The sintering paste is applied to the cover-plate sintered layer 12 and/or the base sintered layer 21 through printing or dispensing. The application thickness is between 5 micrometers and 100 micrometers. The sintering paste includes nanoscale metal particles and a solvent. The metal particles are one or more of gold particles, silver particles, and copper particles. The solvent may be a resin material. After the device base 1 and the cover plate 2 are joined, a heating or baking device, such as an oven, is used to heat the sintering paste. During the heating, pressure may further be applied to the base 1 and the cover plate 2 to allow a sintering material to be more uniformly filled between joining surfaces so as to achieve better encapsulating. As the metal material is fabricated at nanometer level, the activation energy of the surface of the metal particles is relatively high, and the metal particles can start to melt at a relatively low temperature which is between 100° C. and 500° C., typically about 200° C. In the sintered metal material particles, there may be relatively large metal particles and nanoscale metal particles. During sintering, the nanoscale metal particles melt to link the relatively large metal particles together to achieve connection. During actual use, for different sintered materials, the sintering temperature may be chosen from a range from 100° C. to 500° C. Compared with a conventional soldering manner, the heating temperature is significantly reduced, and is not limited to the encapsulating of metal materials, so that the encapsulating costs are lower and the encapsulating is safer and more reliable.

Preferred embodiments of the disclosure are described above in detail. However, the disclosure is not limited to the embodiments. A person skilled in the art may further make equivalent variations or replacements without departing from the principle of the disclosure, and these equivalent variations or replacements shall all fall within the scope defined by the claims of the present application.

The invention claimed is:

1. A semiconductor encapsulation structure, comprising:
   a device base, wherein the device base is provided with a cavity for accommodating a chip, and a top surface of the device base is provided with a metallized cover-plate sintered layer, and
   an upper cover plate, wherein the upper cover plate is provided with a metallized base sintered layer, and the upper cover plate is connected to the device base with sintering paste through the metallized cover-plate sintered layer and the base sintered layer;
   wherein the device base is made of metal, ceramics, glass, plastic or fiberboard, and the upper cover plate is made of metal or ceramics.

2. The semiconductor encapsulation structure according to claim 1, wherein metallizing is conducted by using one or more materials selected from a group consisting of copper, silver, gold, nickel, palladium, aluminum, tin, platinum, and zinc.

3. The semiconductor encapsulation structure according to claim 1, wherein sintering paste for sintering is applied to the metallized base sintered layer and/or the metallized cover-plate sintered layer through printing or dispensing.

4. The semiconductor encapsulation structure according to claim 3, wherein the sintering paste comprises metal particles and a solvent, the metal particles are one or more of gold particles, silver particles, and copper particles, and the solvent is a resin material.

5. The semiconductor encapsulation structure according to claim 3, wherein the sintering paste is applied with a thickness between 5 micrometers and 100 micrometers.

6. The semiconductor encapsulation structure according to claim 3, wherein the sintering paste is baked and sintered by a heating device.

7. The semiconductor encapsulation structure according to claim 6, wherein a temperature of baking and sintering is between 100° C. and 500° C.

8. The semiconductor encapsulation structure according to claim 1, wherein electrically interconnected circuits and the chip are disposed inside the cavity.

9. A method for forming a semiconductor encapsulation structure, comprising following steps:
   forming a device base;
   providing the device base with a cavity for accommodating a chip;
   providing a top surface of the device base with a metallized cover-plate sintered layer;
   forming an upper cover plate;
   providing the upper cover plate with a metallized base sintered layer, and
   connecting the upper cover plate to the device base with sintering paste through the metallized cover-plate sintered layer and the metallized base sintered layer.

10. The method according to claim 9, wherein the device base is made of metal, ceramics, glass, plastic or fiberboard, and the upper cover plate is made of metal, ceramics, glass or quartz.

11. The method according to claim 9, wherein metallizing is conducted by using one or more materials selected from a group consisting of copper, silver, gold, nickel, palladium, aluminum, tin, platinum, and zinc.

12. The method according to claim 9, wherein the sintering paste for sintering is applied to the metallized base sintered layer and/or the metallized cover-plate sintered layer through printing or dispensing.

13. The method according to claim 12, wherein the sintering paste comprises metal particles and a solvent, the metal particles are one or more of gold particles, silver particles, and copper particles, and the solvent being a resin material.

14. The method according to claim 12, wherein the sintering paste is applied with a thickness between 5 micrometers and 100 micrometers.

15. The method according to claim 12, wherein the sintering paste is baked and sintered by a heating device.

16. The method according to claim 15, wherein a temperature of baking and sintering is between 100° C. and 500° C.

17. The method according to claim 9, wherein electrically interconnected circuits and the chip are disposed inside the cavity.

\* \* \* \* \*